(12) United States Patent
Schaper

(10) Patent No.: US 8,499,810 B2
(45) Date of Patent: Aug. 6, 2013

(54) MOLECULAR TRANSFER LITHOGRAPHY APPARATUS AND METHOD FOR TRANSFERRING PATTERNED MATERIALS TO A SUBSTRATE

(75) Inventor: Charles D. Schaper, Union City, CA (US)

(73) Assignee: Transfer Devices Inc., Santa Clara, CA (US)

( * ) Notice: Subject to any disclaimer, the term of this patent is extended or adjusted under 35 U.S.C. 154(b) by 231 days.

(21) Appl. No.: 12/870,622

(22) Filed: Aug. 27, 2010

(65) Prior Publication Data

US 2011/0058150 A1    Mar. 10, 2011

Related U.S. Application Data

(60) Provisional application No. 61/275,203, filed on Aug. 27, 2009.

(51) Int. Cl.
  *B32B 37/00*    (2006.01)
(52) U.S. Cl.
  USPC ...... 156/540; 156/581; 156/583.1; 156/583.3
(58) Field of Classification Search
  USPC ................. 156/230, 234, 235, 359, 538, 539, 156/540, 541, 542, 580, 581, 583.1, 583.3
  See application file for complete search history.

(56) References Cited

U.S. PATENT DOCUMENTS

| 5,300,170 | A | * | 4/1994 | Donohoe | ..................... 156/235 |
| 5,772,905 | A | | 6/1998 | Chou | |
| 6,719,915 | B2 | | 4/2004 | Willson et al. | |
| 6,849,558 | B2 | | 2/2005 | Schaper | |
| 7,345,002 | B2 | | 3/2008 | Schaper | |

* cited by examiner

*Primary Examiner* — James Sells
(74) *Attorney, Agent, or Firm* — Schneck & Schneck; Thomas Schneck; Mark Protsik

(57) ABSTRACT

A system and method to implement a molecular transfer lithography process is described. A destroyable nanopatterned template coated with functional material is attached to a removable carrier that is held suspended over a substrate, and a shaped pressure pad brings the functional material into contact with the substrate, initiating adhesion of the functional material to the surface of the substrate, and then detracting the pressure pad from the substrate. The substrate with destroyable template and removable carrier is then sent for further processing. In a preferred embodiment, the system and method are used to process a patterned polyvinyl alcohol template coated with a functional material that is thermal adhered to a substrate and after pressing, subjected to a water bath to dissolve away the template and carrier, leaving the functional material patterned on the substrate.

32 Claims, 5 Drawing Sheets

(A)

(B)

(C)

(D)

MOLECULAR TRANSFER LITHOGRAPHY APPARATUS AND METHOD FOR TRANSFERRING PATTERNED MATERIALS TO A SUBSTRATE

CROSS-REFERENCE TO RELATED APPLICATION

The present application claims priority under 35 U.S.C. 119(e) from prior U.S. Provisional Application 61/275,203, filed Aug. 27, 2009.

STATEMENT REGARDING FEDERALLY SPONSORED RESEARCH OR DEVELOPMENT

This invention was made with government support under contract number W31P4Q09C0377 awarded by the Defense Advanced Research Projects Agency (DARPA), and under grant numbers NSF0646183 and NSF1013514 awarded by the National Science Foundation (NSF). The government has certain rights in the invention.

TECHNICAL FIELD

The present invention relates to lithography apparatus and processes for transferring high-resolution micropatterns and nanopatterns to a substrate, including for applications such as semiconductors, magnetic memory, photonics, optics, optoelectronics, displays, solar cells, micro-electromechanical systems (MEMS), biochips, energy storage and fuel cells.

BACKGROUND ART

For producing high resolution patterns in materials using cost effective methods, procedures of patterning involving the contact of a master pattern into resist have shown promise and practical application, which include nanoimprint lithography as described in U.S. Pat. Nos. 5,772,905 and 6,719,915. In this approach, a topographical relief pattern on a master, which is made of polymer or a hard material like quartz or silicon, is pressed into a polymer film on a substrate, which is then the polymer film is cured, and the master retracted after from the polymer film to reveal the pattern. While the technique has advantage in simplicity and high resolution, its disadvantages include the defects and lowered yields generated from the separation of the master from the polymer film that can fracture the material during the separation process or otherwise contaminate the master. In addition, the separation step and reloading of the master for the next substrate lowers the throughput for the approach to nanoimprint lithography. Because the material needs to be curable when fully encased by the master, it is not possible to pattern materials that contain solvents requiring interaction with the environment in order to evaporate during the patterning process.

To provide a solution to these problems, molecular transfer lithography (MxL) as described in U.S. Pat. No. 6,849,558 is a technique in which a dissolvable template made of polyvinyl alcohol (PVA) as described in U.S. Pat. No. 7,345,002 is used to produce patterns that involve the adhesion onto substrates of functional materials coated on patterned PVA templates, followed by the dissolution of the PVA template to leave the patterned material on the substrate. The PVA template is formed by first casting a PVA-based solution on a master substrate that has a topographical pattern produced by means such as photolithography or electron beam lithography; and then from the master removing the dried PVA film, which yields a template with a relief pattern of an image inverse to that of the master.

Of MxL and PVA templates, the innovation is a materials transfer printing that couples water-dissolvable, ultra-high resolution templates coated with functional materials including polymers that are pre-processed while on the templates prior to transfer onto substrates that include silicon, plastic and glass. The materials transfer printing process employing dissolvable templates enables a unique way to form high resolution patterns and has several advantages over alternative methods like nanoimprint lithography, embossing or soft lithography, including: (1) a conformal template for patterning over significant variations in substrate flatness, (2) a large-area patterning capability because it dissolves away eliminating frictional effects from physical separation, or step-and-repeat and stitching complications, (3) a material transfer process by which the template is coated due to compatible surface tension that enables thin residual layers and eliminates the fluidic displacement challenges of imprinting, (4) eliminates defect propagation problem of contact printing through the use of a dissolvable one-time-per-use disposable template, (5) a solution to the "demolding" defect generation problem of contact printing by elimination of that step, (6) ability to work with masters from a variety of materials including opaque materials like silicon, (7) coating the template rather than the substrate provides access to the interfacial layer prior to bonding, enabling secondary processing steps, (8) fewer steps than imprint lithography at the fabrication site, since it eliminates the need to coat the material on the substrate because the water-soluble template is pre-coated with a dried, cured resist, (9) apparently very little or zero interfacial mixing between the water-soluble template and the functional materials of interest based on the high resolution results, (10) ultra-high resolution, polymeric template to 25 nm and lower, (11) potential for high Young's modulus with complete drying relative to elastomeric materials, (12) ultra-high aspect ratios to at least 5:1 because of the water dissolution nature of the template, (13) low-cost materials which enables a consumable approach to patterning, (14) fast drying times in forming a replicated template involving simple spin-coating methods, (15) is water-dissolvable thereby making for an environmentally friendly approach to nanopatterning, as well as reducing the costs and hazards associated with materials handling and disposal, (16) works well with solvent containing materials because the solvent can be evaporated after coating to achieve pattern formation prior to transfer, thereby eliminating the need to deform a solid thin film in an alternative embossing scheme, (17) although the template dissolves in water, it does not dissolve in organic solvents and can therefore be coated, (18) the surface energy of the template permits coating of materials onto the template using spin-coating methods, whereas other template surfaces are too slippery to permit the materials on the surface, (19) ability to vacuum deposit metallic materials onto the template prior to transfer printing onto substrates, thereby eliminating etching for products whether on plastic or glass.

To automate the transfer of materials from the template to the substrate for Molecular Transfer Lithography, the tool must perform the adhesion operation without introducing voids or entrapping air bubbles. While it is possible to retrofit imprint tools or contact photolithography tools, which are designed to maintain hold of the master or mask during the patterning process, such tools use rigid backs to perform the contact, which would prevent the conformal contact of dissolvable template to the substrate. Because the imprint tools are designed to hold onto the master or mask, it is time consuming to load a new template into such a system, which would be the case for the MxL procedure, and therefore the yield would decrease. It is possible to load the template onto the wafer, and then move both into the chamber, but contacting the template onto the substrate before bonding can lead to air inclusions or partial bonding before the adhesion process begins.

SUMMARY DISCLOSURE

A system and method are described to implement the molecular transfer lithography process. The system utilizes a shaped pressure pad connected to a drive system so that the pad is brought into contact with a template pre-coated with patterned material, such as a patterned dissolvable PVA template coated with a resist. The pad provides adequate force, when combined with sufficient temperature and time, to affect an adhesion of the transferred materials onto the substrate. A temperature-controlled hotplate may be used to heat the substrate. A carrier connected to a holder can suspend the template in position over the surface of the substrate prior to its transfer.

In particular, an embodiment of the molecular transfer lithography apparatus comprises a stage for supporting a substrate to be processed, a carrier for a patterned template coated with a material to be transferred to the substrate, a holder for the carrier, a deformable pad, and a mechanism both for pressing the deformable pad against the carrier attached to the template and for subsequently lifting the deformable pad from the carrier. The carrier suspends the template over the substrate, which can be pressed by the deformable pad. Pressing the deformable pad against the carrier attached to the template brings the patterned material into contact with the substrate so as to adhere the patterned material to the substrate. The pad, which may be constructed of an elastomer material, is preferably shaped so as to first contact the center of the template and then spread in a radial direction as the pad is further compressed to avoid the formation of bubbles. The patterned material may be composed of a material that is capable of adhering onto the substrate when subjected to heat, pressure and/or time. Thus, the stage may comprise a hot plate containing a temperature controllable element to raise the temperature of the substrate so as to adhere the patterned material. The carrier may be fabricated of water-soluble material. The patterned template is fabricated of polyvinyl alcohol replicated from the surface of a master pattern, while the material to be transferred may be water-insoluble, so that when the template is dissolved, the patterned material remains on the substrate. Alternatively, the carrier may be released from the template by heat or UV light and the template may be destroyed in other ways such as by heating or etching, provided the patterned material is impervious to whatever technique is used to destroy the template.

In a nanolithography apparatus of the type having a stage supporting a substrate, a stage supporting a carrier attached to a template with a material to be transferred, and a press pad movable up and down for applying pressure onto objects between the stages, patterned materials transfer to the substrate is affected with a releasable carrier that supports a hardened water-soluble template of an image of a master pattern having a coating of water-insoluble resist forming an inverse image of the template image, a motion means for bringing the resist on the template and the substrate together forcing the resist into contact with the substrate, adhesive means for adhering the resist to the substrate, and means for releasing the carrier from the template and applying water to wash away the template and leave the image of the master in the resist adhered to the substrate.

A nanopatterning process for transferring materials as structured patterns to a substrate using such an apparatus begins by supporting the substrate on a stage and suspending a carrier attached to a patterned template over the surface of the substrate, the template being coated with a material to be transferred to the substrate. Next, a deformable pad presses onto the back of the carrier such that the patterned material comes into contact with the substrate and adheres thereto. As mentioned, the stage may be heated to facilitate adhesion of the patterned material to the substrate. To complete the procedure, after the pad is retracted, the carrier may be released from the template when the carrier and the template are moved into a water bath and the carrier and template is dissolved away. Again, other methods of removing the carrier and destroying the template material while leaving the patterned material adhered to the substrate could be used.

DETAILED DESCRIPTION

Disclosed herein are a system and method for conducing molecular transfer lithography processes in which functional materials deposited on the surface of a destroyable template are adhered to the surface of a substrate. The system that presses a nanopatterned dissolvable template coated with functional materials onto a substrate consists of a pressurized cylinder, a polymer pad, a holder for the dissolvable template to suspend the template above the substrate, and a temperature plate to support the substrate. The method involves pressurizing the cylinder to push the pad onto the back of the polymer dissolvable template to drive the functionalized material onto the surface of the substrate, which undergoes an adhesion process that after retracting the cylinder and pad enables the functionalized material to remain on the surface of the substrate. Afterwards the substrate with the template and holder assembly is subjected to a water bath, which dissolves the template and leaves the patterned functional resist on the surface of the substrate. To achieve a pattern transfer free of defects, it is necessary to operate the unit with sufficient pressure, temperature and time, as well as to design the shape and hardness of the pressure pad appropriately, to remove the possibility of air inclusions.

Figure 1:
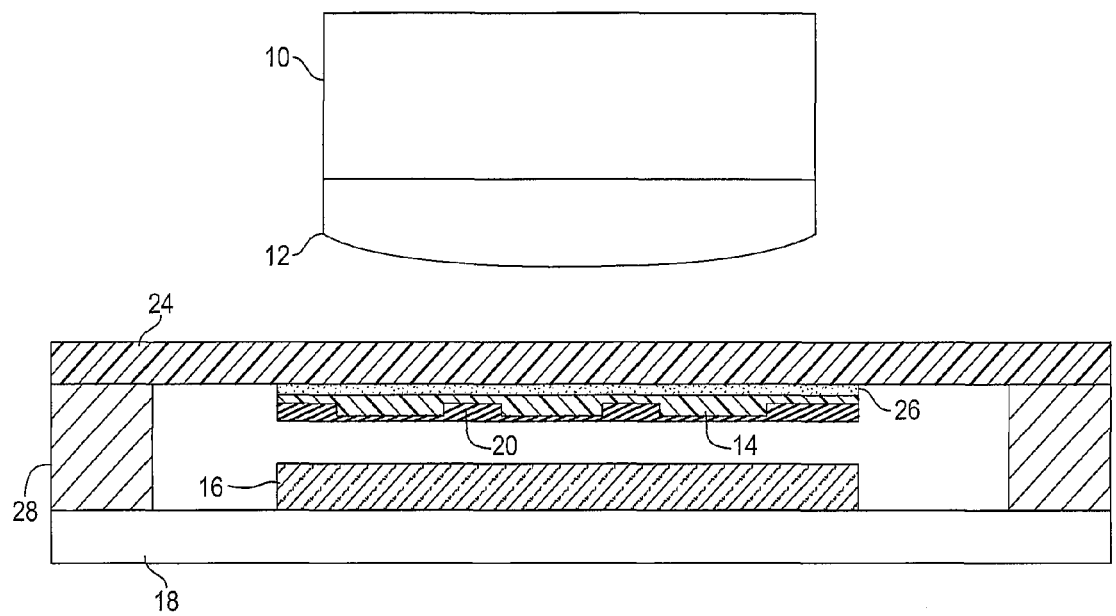
FIG. 1 is a schematic side view of a system in accord with the present invention that involves the use of a deformable plastic pad to bring the functional material on a template into contact with a substrate.

To supply the movement that contacts the template with holder to the substrate for nanopatterning, the system of FIG. 1 includes a cylindrical rod 10 that is pressurized with air or in other embodiments with another gas like nitrogen, or through an electrical motor, or with a hydraulic system. At the end of the cylindrical rod 10, a pressure pad 12 is placed, consisting of an elastomeric pad made of a rubber material that can be shaped as in a loaf so that when it is pressed against a hard surface, it deforms in the center first and then outward. When the cylindrical rod is extended, the pad contacts the back of the carrier 24 which consists of a polymer sheet connected with an adhesive 26 to the patterned template 14, which in turn presses the functional material 20 to be transferred onto the substrate 16 without distortion or air bubble formation. To achieve temperature control, a hotplate 18 supports the substrate, and is preset and controlled to a temperature set point to enable the adhesion process. A holder 28 supports the carrier 24.

Another embodiment of the shape of the pad 12 besides a loaf is a dome shape, a flat shape, or a slanted tapered shape. Although the use of an adhesive 26 is preferred to contact the carrier to the template, another embodiment involves no adhesive but some other means of association like static charge or surface tension between the template and carrier.

To align the template 14 to the substrate 16 prior to the press operation, the system includes an imaging system to measure the relative distance between corresponding alignment marks on the substrate and the template. From feedback provided by the imaging system, a correction is made to the relative position of the template to the wafer by manipulating the position of the template stage in the x and y directions such that the alignment marks from the template are positioned so as to match those of the wafer. During the load of the wafer 16 and template 14 into the press, and during the pressing operation, the position of the wafer and template are held fixed so as to achieve aligned patterning within the lateral distortion limits induced by the pressing operation. For higher accuracy alignment, a stiffer template backing is useful.

Figure 2:
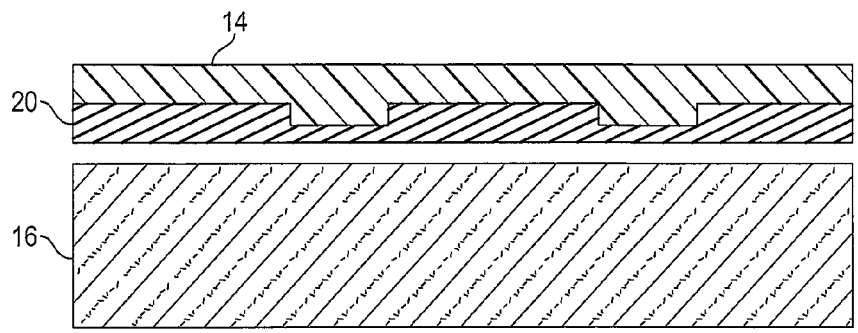
FIGS. 2A-2D are schematics illustrating steps of a molecular transfer lithography process, as disclosed in prior U.S. Pat. No. 6,849,558, that involves the adhesion onto a substrate of a functional material coated on a destroyable patterned template, and then destroying the template through dissolution.
Figure 2:
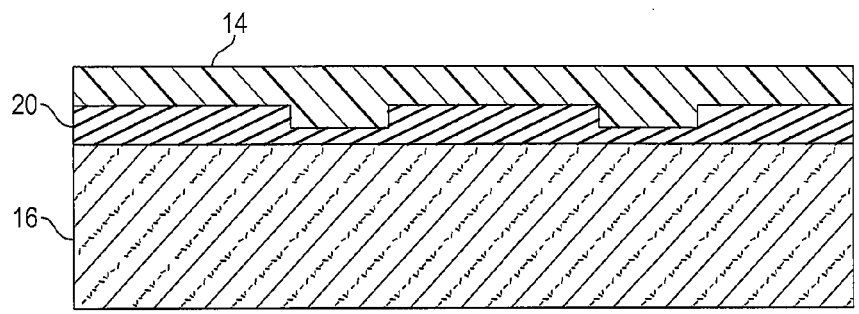
Figure 2:
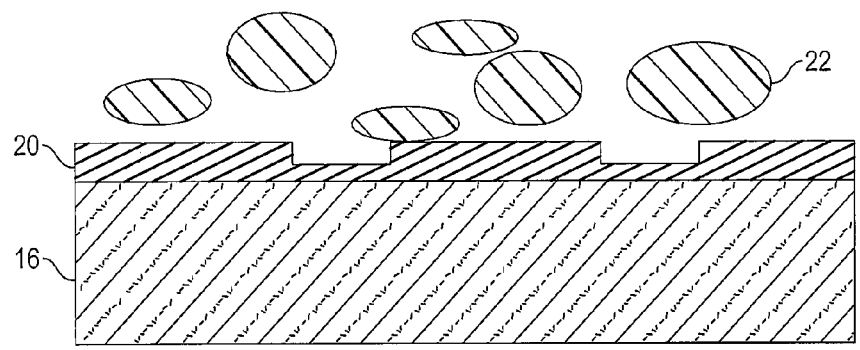
Figure 2:
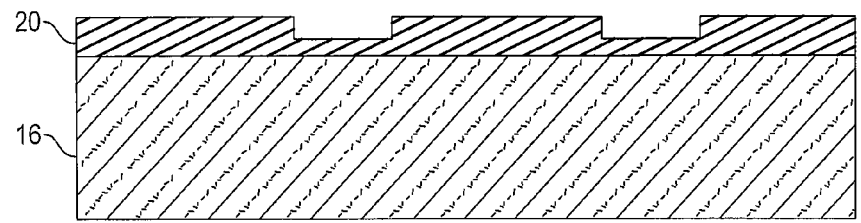

The molecular transfer lithography process has several embodiments, one of which, from U.S. Pat. No. 6,849,558, is depicted in FIGS. 2A-2D involving the transfer of a coating on a dissolvable template, fabricated of polyvinyl alcohol (PVA), to a substrate. The template 14 is depicted in FIG. 2A, which is coated with a material 20 to be transferred to the substrate. This material may be a photoresist such as SU-8, cross-linked, to be transferred onto a substrate 16. After adhering the material 20 from the template 14 onto the substrate 16 as shown in FIG. 2B, it is then subjected to a water bath as in FIG. 2C to dissolve away the PVA template, 22, leaving the transferred patterned resist material 20 on the substrate 16 in FIG. 2D.

To transfer materials that are water-soluble and would affect the PVA template if applied directly, such as a solution of spin-on glass, the PVA template may be first coated with a thin polymer layer that can act as a barrier, like Omnicoat from Microchem, which will permit the subsequent coating of the water-soluble materials on the PVA template prior to its transfer using the system.

Figure 3:
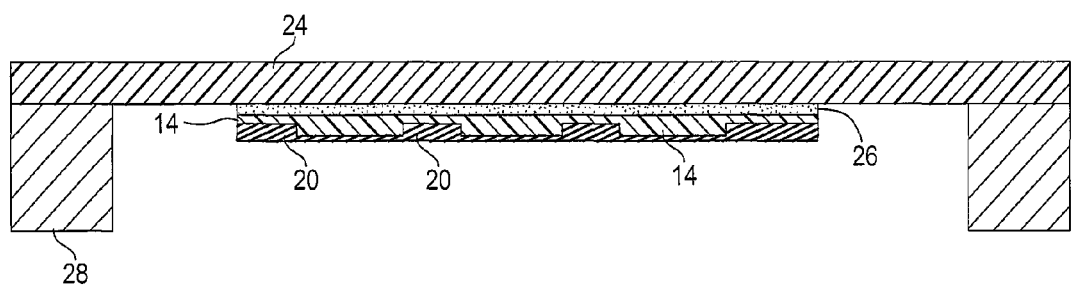
FIG. 3 is a schematic side view of a dissolvable template that is connected to a carrier, which in turn will be attached to a holder and suspended over a substrate in the system of FIG. 1.

Referring to FIG. 3 that depicts the dissolvable template coated with functional materials attached to the carrier 24, a pre-forming process is used to construct the dissolvable template 14 consisting of a polyvinyl alcohol (PVA) based solution to form a solid dissolvable replica of a master pattern. The template 14 is then coated with the functional material 20, which may be a photoresist, a phosphor compound, a sol-gel, an adhesive, an ink, a conductive ink, a paste, a UV curable material, a partially exposed or fully exposed resist, a thermally curable material, a moisture mechanism curable material, a polymer, or other materials that can be coated onto the dissolvable template without dissolving it. The template 14 is connected to a carrier 24 through an adhesive mechanism 26. The carrier 24 may be made of a water dissolvable film of pre-formed PVA. Another embodiment of carrier 24 may be a polyester sheet with a siliconized surface or other plastic film. Another embodiment may be that the carrier 24 is a multilayered structure consisting of the PVA sheet that is adhered to the template and a backing material of a plastic sheet connected to the PVA sheet. The carrier 24 is attached to the template during the replication process, in which the carrier is attached through an adhesive after the template is formed, or as part of the template making procedure. The adhesive mechanism 26 attaching the template to the carrier may be a water-soluble adhesive, that is UV cured. Other embodiments of the carrier adhesive 26 includes a glue that is tacky at room temperature and water soluble adhesive, or non-water soluble adhesive, or is attached through static forces or pressed onto the surface, or through a thin layer of liquid like alcohol with sufficient surface tension to keep it in place. The holder 28 may take the form of a grip ring, in which the carrier 24 is held in between two concentric circular rings through compression, or a frame, in which the carrier 24 is attached to a holder 28 through the frame ring through an adhesive, or other similar mechanical clamping devices.

Other embodiments of the carrier 24 include a heat release tape, such as Revalpha from Nitto Denko, that when heated, its adhesive 26 releases the PVA template from the backing material. The heat release tape may be incorporated during the formation of the template by adhering it to the coated PVA when removing it from the master during the PVA template replication process, or added after the PVA template has been formed by adhesion of the PVA template to the heat release tape. The heat release tape may then function as the carrier alone or may be further taped to a plastic sheet to collectively function as the carrier, which is then attached to the holder.

Another embodiment for carrier 24 is to use a UV release tape such as that available from Lintec, in which the PVA template is adhered to the UV release tape, which when the adhesive 26 is exposed to a UV light source releases the backing film comprising the carrier from the PVA template. It is possible to either adhere the PVA template to the UV release tape after the template has been formed, or incorporated within the template formation process by using it as the carrier when removing the PVA film from the master.

To support the carrier 24 of the template 14, other embodiments include a mechanical clamping or vacuum support assembly instead of the grip ring or film frame, particularly if the backing film is sufficiently rigid, such as the use of a 100-micron thick PET substrate with the heat release tape.

It is an objective to replicate the patterned template 14 attaching it to the carrier sheet 24 through an adhesive 26 as part of the replication procedure, associate a functional material 20 to the surface of the template 14; and then transport this construct to the operator of the transfer machine, who then connects the carrier 24 to the holder 28, suspending over a substrate 16. Another embodiment includes having multiple layers of carriers to improve its handling, for example the PVA template adhered with a water-soluble adhesive to a PVA pre-formed sheet, and then the heat release tape adhered to the back of the PVA pre-formed sheet. To further improve its handling, a rigid frame or ring may be attached to the periphery of the carrier 28, of which the frame would then insert onto the holder.

Figure 4:
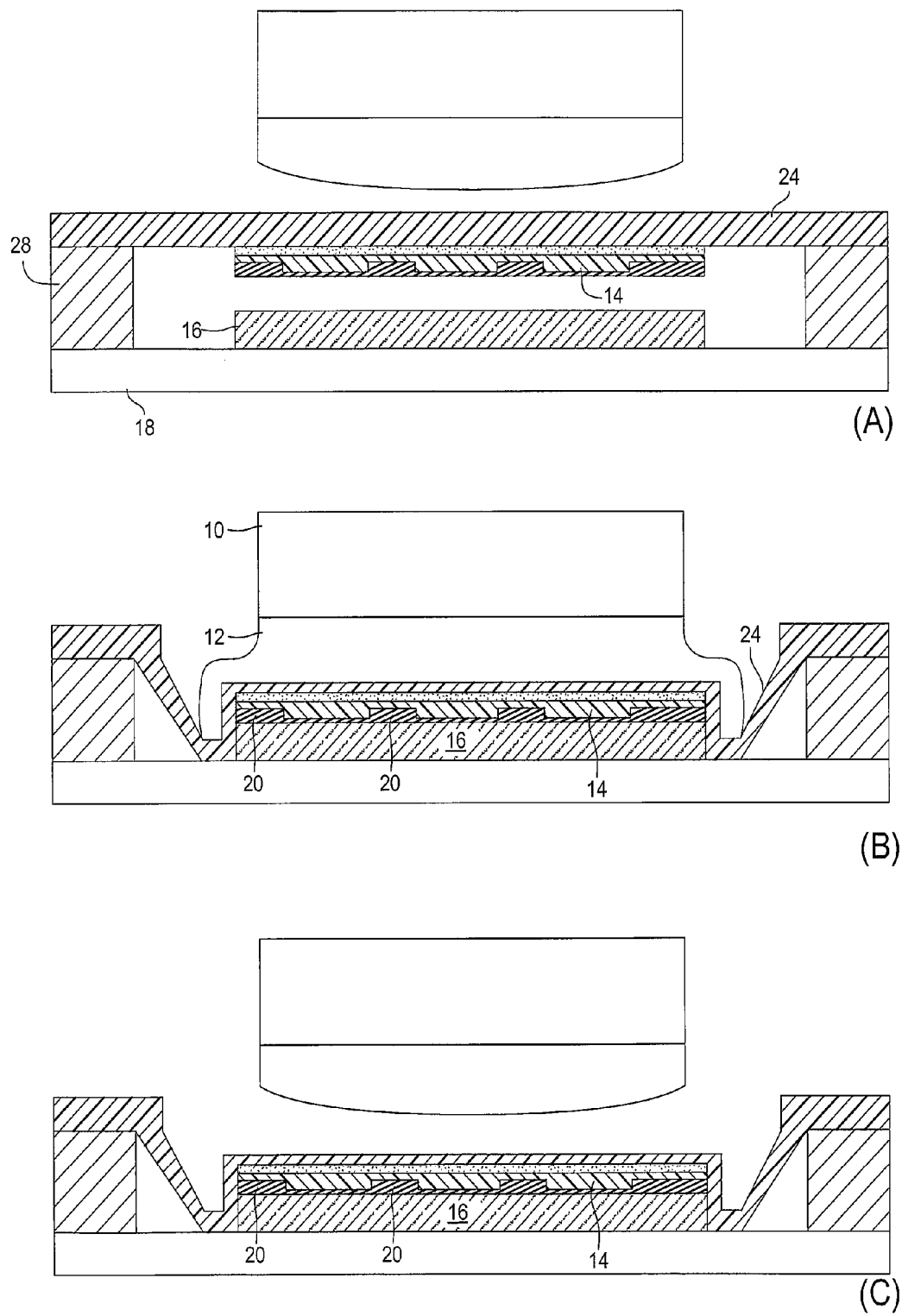
FIGS. 4A-4C are schematic side views illustrating the operation of the system of FIG. 1 in conducting a molecular transfer lithography process, wherein a pad is brought into contact with the template and brings it into contact with the substrate, undergoing an adhesion process, and then the pad is retracted.

In FIGS. 4A-4C, the operation of the system is depicted, starting with FIG. 4A of aligning the template 14 to the substrate 16. The substrate 16 is positioned on a stage 18. The holder 28 is positioned upon or held slightly above the stage 18 so that the carrier 24 holds the template 14 suspended in position, resist-side-down, above the substrate 16. Afterwards, as shown in FIG. 4B, the cylinder 10 of the press machine is brought into an extended position to press the elastomeric pad 12 downwards onto the back of the carrier 24 and its template 14, bringing the template 14 with material 20 into contact with the substrate 16. The pad is kept into contact with the carrier 24 for a predetermined period of time and then retracted, leaving the patterned material 20 stuck onto the substrate 16, along with the template 14 and carrier 24 as indicated in FIG. 4C.

While the pressure of the equipment is generally specified around 100 PSI, the operation of the equipment as defined as the temperature and time is dependent upon the material that is to be transferred. For the case of a resist such as SU-8 as the functional material 20, which is coated and cured on the dissolvable template prior to its implementation within the equipment, a temperature of 130° C. at the thermocouple setting within the hot plate, which is less at the surface by around 20° C., a time of 40 seconds results in bubble free transfer of the PVA template, consisting of a PVA replicated film bonded to PVA sheet through a water soluble UV curable adhesive. For material formulations, such as an indium tin oxide sol-gel solution, similar conditions are also satisfactory to permit transfer. If lower temperature is used then it is necessary to increase the time such that the resist has ample opportunity to become tacky enough to permit adhesion with the underlying substrate.

For applications in which the functional material is in a liquefied state prior to transfer, which is the case for a UV curable adhesive or an instant adhesive that cures over time, because the opportunity for void formation is reduced, decreasing the time and the temperature to nominal values of around 10 seconds and 40° C. have been found to be acceptable. In the case of a UV curable adhesive, after transferring the material to the surface, the next step involves curing the adhesive through the application of UV light or additional heat.

After contacting the functional material on the template to the substrate, retracting the pad and removing it from the chamber, further processing of the functional material while it is still attached to the template may provide a practical or necessary effect. Such is the case for a UV curable adhesive, which if it is not fully cured due to the temperature provided by the hot plate may be subjected to UV light to fully cure the material prior to removal of the template in order to maintain its shape.

To improve adhesion of the functional material to the substrate, pre-processing steps may be of use in modifying the surfaces of the functional material on the template or of the substrate. There are well-known methods to improve adhesion of a substrate like silicon wafer, which improves its ability of association with organic materials when it first undergoes vapor prime with HMDS. Alternatively or together, the adhesion capability of the functional material may be improved through available reactive sites which can interact with vapor phase precursors or other functional groups: for example, a silane or alumina precursor can facilitate the association of a hydroxyl group to an epoxy or amine group to act as an adhesive layer when placed into contact with a substrate.

Figure 5:
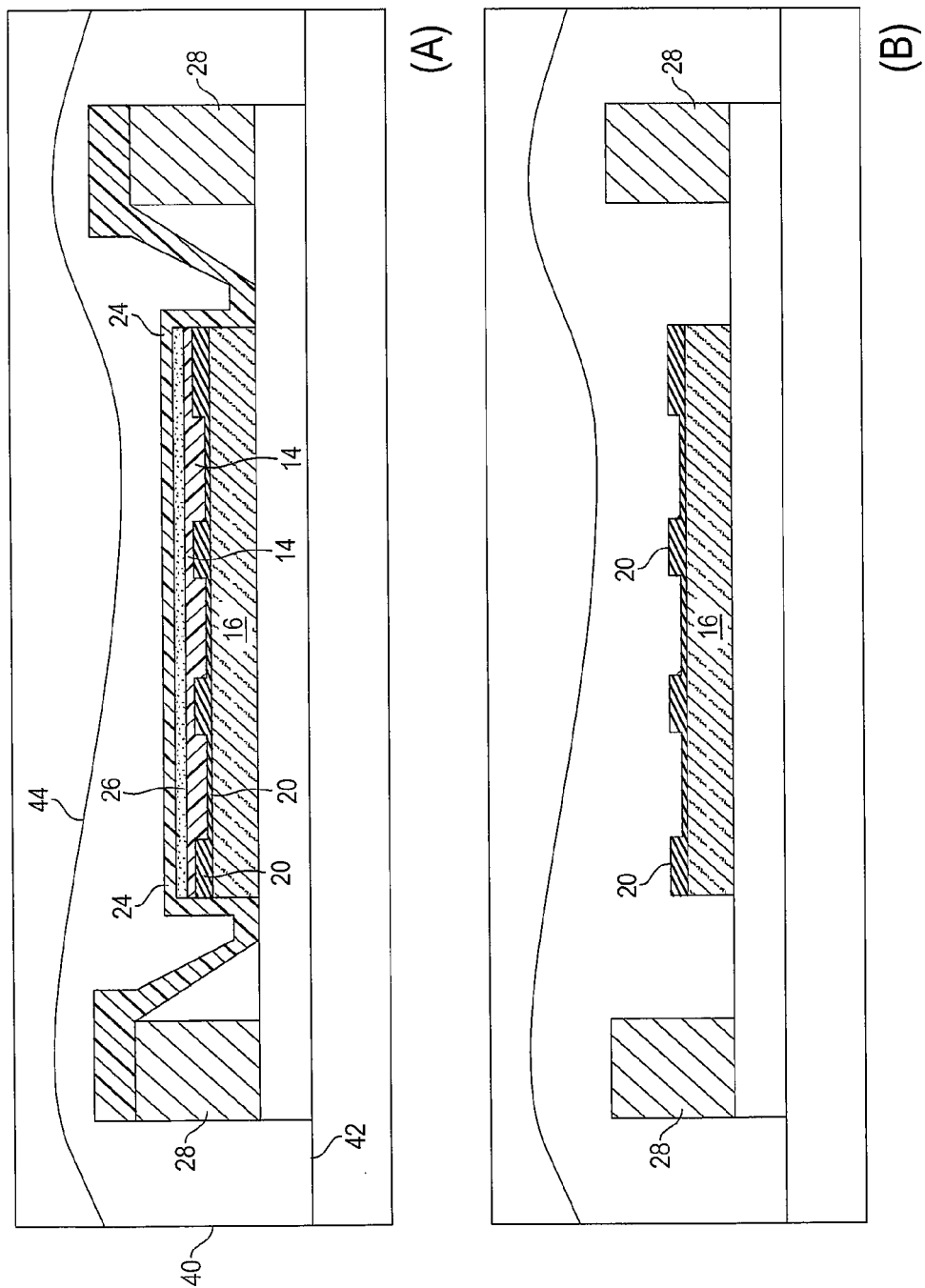
FIGS. 5A-5B are schematic side views illustrating that to complete the process, after removal from the system of FIG. 1, the template and substrate are subjected to a water bath, which dissolves the template and leaves the patterned functional material on the surface of the substrate.

To remove the template, the substrate 16 and the entire attached template assembly (template 14, adhesive 26, carrier 24, holder 28) is placed into a water bath, 40 on a support rack 42, as seen in FIG. 5A, where water 44 is circulated over the surface. After a period of time, the carrier 24, adhesive 26 and template material 14 is dissolved from the functional material 20 and the patterned wafer 16 is available for removal and subsequent processing as in FIG. 5B. It may be advantageous to remove the holder 28 from the carrier 24 before dissolution.

With the use of heat or UV release tape as the carrier 24, because the tape adhesive 26 allows the separation of the carrier 24 from the template 14 as part of either the pressing process that involves heat or through secondary processing, the substrate thereby is adhered only to the PVA template 14, which would be placed within the water bath, at which time the PVA template is dissolved leaving the functional materials patterned on the surface of the substrate. With the use of heat-release tape as a carrier, when the apparatus performs the adhesion of the functional material to the substrate using heat, it may be possible to not only achieve adhesion of the functional material to the substrate but also release the carrier from the template provided that the adhesion temperature exceeds the release temperature. In this case, only the substrate, the functional material 20, the template 14 would be placed in the water bath.

Other methods of destroying the template to remove it without affecting the functional materials include high temperature heating to decompose and evaporate the thin film of PVA, which requires that the functional materials not significantly degrade during the heating process. Still other methods of destroying the template to remove it without appreciably affecting the adhesion of the functional materials on the surface of the substrate include peeling the full template or portions of it away from the surface, which for some patterns may induce defects into the pattern but still may be within specification depending upon its application.

In addition to single substrate processing, because the system is capable of large area pressing dependent upon the size of the press-pad and force applied by the pressing mechanism, multiple substrates may be loaded into the chamber and adhered to the patterned functional materials provided that the template and carrier assembly is large enough to encompass the substrates to be patterned. For a large area master, such as a 300 mm patterned semiconductor wafer, large area templates may be formed through the replication process while attached to a large area carrier and then brought into the pressing system.

Figure 6A:
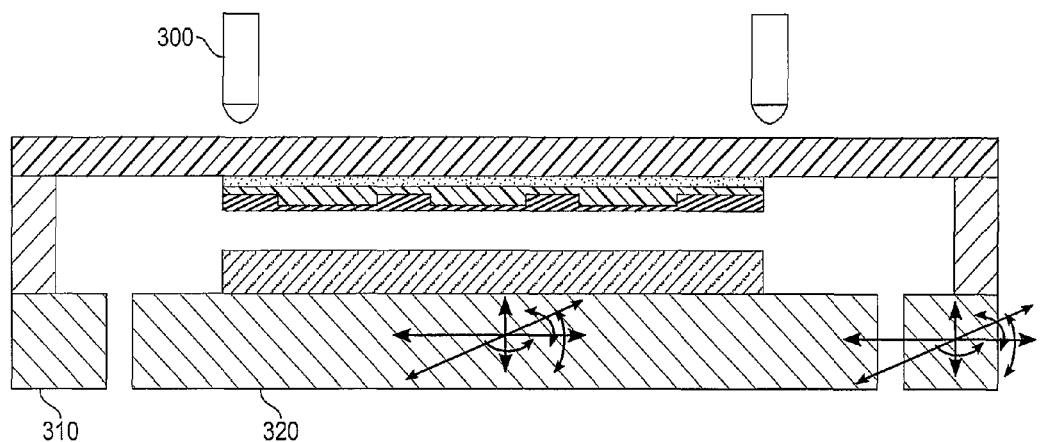
FIGS. 6A-B are a schematic side view and a block diagram that illustrate that to position the template relative to the wafer, independent stages for the template and substrate are manipulated such that corresponding marks on the template and substrate, as measured by optical microscopes, are aligned.
Figure 6B:
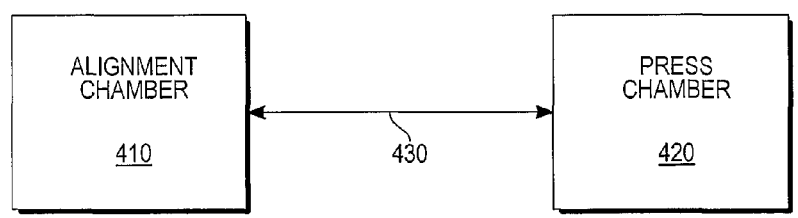

For multiple layer processing, it is necessary to register the template to the substrate, of which the preferred embodiment is depicted in FIG. 6A consisting of alignment stages for both the template 310 and the substrate 320 with up to six-degrees of control, x-y-z and angular articulation about each axis. After the template and substrate are loaded onto the respective stage, because the template is partially transparent, microscopes 300 are used to measure at least two alignment marks, such as crosses, on both the template and wafer, either simultaneously within the same field of view, or through microscopes dedicated to one surface or the other. As indicated in FIG. 6B, after the substrate and template are aligned in an alignment chamber 410, both are loaded into the press chamber 420 through an actuation mechanism 430. Another embodiment is incorporating the microscopes within the press chamber to reduce the error of positional inaccuracies due to loading of the substrate and template into the press without feedback control.

The invention claimed is:

1. A patterning system for transferring materials to a substrate, comprising:
    a carrier for a destroyable patterned template coated with a material to be transferred to the substrate and
    a transfer apparatus with
        a stage for supporting a substrate to be processed;
        a holder above the stage for receiving the carrier;
        a deformable pad above the carrier;
        a mechanism for pressing the deformable pad against the carrier'attached to the destroyable patterned template, thereby bringing the patterned material on the template into contact with the substrate so as to adhere the material to the substrate, and subsequently lifting the deformable pad from the carrier and template; and
        a template destruction station wherein the template is subjected to a destruction process, the patterned material being impervious to the template destruction process and remaining on the substrate.

2. The system as in claim 1 wherein said holder is located so as to suspend the template on its carrier above the surface of the substrate until pressed by movement of the deformable pad against the template.

3. The system as in claim 1 wherein said pad is shaped so as to first contact the center of the template and spread in a radial direction as the pad is further compressed.

4. The system as in claim 1 wherein said pad is constructed of an elastomer material.

5. The system as in claim 1 wherein said patterned material is composed of a material that is capable of adhering onto the substrate when subjected to heat, pressure, and, time.

6. The system as in claim 5 wherein said patterned material that is capable of adhering is selected from any of a resist, a thermally-cured adhesive in solid form, a UV-curable adhesive, an adhesive that cures over time, a sol-gel, a polymer, a phosphor solution, an optical adhesive, a single molecular layer film, an ink, a partially exposed resist, a conductive ink, a nanoparticle solution, a spin-on dielectric, a metallic film, and multiple layers of such materials.

7. The system as in claim 1 wherein said stage comprises a hot plate containing a temperature controllable element to raise the temperature of the substrate.

8. The system as in claim 1 wherein the template destruction station is a water bath and said carrier comprises a water-soluble sheet.

9. The system as in claim 1 wherein said carrier comprises a heat-release tape.

10. The system as in claim 1 wherein said carrier comprises a UV-release tape.

11. The system as in claim 1 wherein said carrier comprises a combination of water-soluble sheet, heat-release tape, and UV-release tape.

12. The system as in claim 1 wherein said carrier is attached when forming the template.

13. The system as in claim 1 wherein said carrier has a rigid frame for handling, the holder adapted for holding the carrier by its rigid frame.

14. The system as in claim 1 wherein said template is coated with a polymer barrier film to permit the coating of materials.

15. The system as in claim 1 wherein said template is fabricated of polyvinyl alcohol replicated from a master, pattern.

16. The system as in claim 1 wherein the template destruction station is a water bath and said template is destroyed by dissolving it in water.

17. A lithography apparatus for transferring patterns to a substrate, comprising:
    a stage for supporting a substrate to be processed;
    a holder for receiving a carrier of a destroyable patterned template coated with a patterned material to be transferred to the substrate;
    a deformable pad;
    a mechanism for pressing the deformable pad against the destroyable patterned template, thereby bringing the patterned material into contact with the substrate so as to adhere the patterned material to the substrate, and for subsequently lifting the deformable pad from the template; and
    a template destruction station wherein the template is subjected to a destruction process, the patterned material being impervious to the template destruction process and remaining on the substrate after destroying the template.

18. The apparatus as in claim 17 wherein said holder is located so as to suspend the template on its carrier above the surface of the substrate until pressed by movement of the deformable pad against the template.

19. The apparatus as in claim 17 wherein said pad is shaped so as to first contact the center of the template and spread in a radial direction as the pad is further compressed.

20. The apparatus as in claim 17 wherein said pad is constructed of an elastomer material.

21. The apparatus as in claim 17 wherein said patterned material is composed of a material that is capable of adhering onto the substrate when subjected to heat, pressure, and time.

22. The apparatus as in claim 21 wherein said patterned material that is capable of adhering is selected from any of a resist, a thermally-cured adhesive in solid form, a UV-curable adhesive, an adhesive that cures over time, a sol-gel, a polymer, a phosphor solution, an optical adhesive, a single molecular layer film, an ink, a partially exposed resist, a conductive ink, a nanoparticle solution, a spin-on dielectric, a metallic film, and multiple layers of such materials.

23. The apparatus as in claim 17 wherein said stage comprises a hot plate containing a temperature controllable element to raise the temperature of the substrate.

24. The apparatus as in claim 17 wherein the template destruction station is a water bath and said carrier comprises a water-soluble sheet.

25. The apparatus as in claim 17 wherein said carrier comprises a heat-release tape.

26. The apparatus as in claim 17 wherein said carrier comprises a UV-release tape.

27. The apparatus as in claim 17, wherein said carrier comprises a combination of a water-soluble sheet, a heat-release tape, and a UV-release tape.

28. The apparatus as in claim 17 wherein said carrier is attached when forming the template.

29. The apparatus as in claim 17 wherein said carrier has a rigid frame for handling, the holder adapted for holding the carrier by its rigid frame.

30. The apparatus as in claim 17 wherein said template is coated with a polymer barrier film to permit the coating of materials.

31. The apparatus as in claim 17 wherein said template is fabricated of polyvinyl alcohol replicated from a master pattern.

32. The apparatus as in claim 17 wherein the template destruction station is a water bath and said template is destroyed by dissolving it in water.

\* \* \* \* \*